(12) United States Patent
Lamb

(10) Patent No.: US 6,646,478 B2
(45) Date of Patent: Nov. 11, 2003

(54) METHOD AND APPARATUS FOR INCREASING CAPTURE RANGE AND JITTER TOLERANCE IN PHASE DETECTION CIRCUITS

(75) Inventor: Jonathan Lamb, Ringwood (GB)

(73) Assignee: Semtech Corporation, Camarillo, CA (US)

(*) Notice: Subject to any disclaimer, the term of this patent is extended or adjusted under 35 U.S.C. 154(b) by 0 days.

(21) Appl. No.: 10/230,619

(22) Filed: Aug. 29, 2002

(65) Prior Publication Data

US 2003/0184346 A1 Oct. 2, 2003

Related U.S. Application Data

(60) Provisional application No. 60/367,792, filed on Mar. 26, 2002.

(51) Int. Cl.[7] .............................................. G01R 25/00
(52) U.S. Cl. .......................................... 327/12; 327/3
(58) Field of Search ...................................... 327/3–12

(56) References Cited

U.S. PATENT DOCUMENTS 5,966,033 A * 10/1999 Miller ............................ 327/3
5,977,801 A * 11/1999 Boerstler ........................ 327/7

* cited by examiner

Primary Examiner—Kenneth B. Wells
(74) Attorney, Agent, or Firm—O'Melveny & Myers LLP

(57) ABSTRACT

A phase detection system allows the capture range, lock range and jitter tolerance to be extended beyond ±360°. The capture range for the phase detection system may be extended in programmable amounts up to several thousand clock cycles or can be set to any desired maximum capture range in steps of approximately 360°. The phase detection system circuit utilizes a coarse phase detector and a fine phase detector. The phase detection system uses the digital cycle slip counter phase detector to provide a wide phase capture and lock range for a large jitter tolerance. The phase detection system combines this detector with a fine phase measurement from a PFD (phase and frequency detector) for very accurate phase control and low output jitter. The PFD operates in the approximately ±540° range and provides overlap in response with a coarse phase detector using a digital cycle counter approach. The PFD allows the digital counter, used for coarse cycle slip tracking, to precondition the PFD so that the coarse and fine detectors work together with no dead-band and no conflict in responses.

17 Claims, 9 Drawing Sheets

METHOD AND APPARATUS FOR INCREASING CAPTURE RANGE AND JITTER TOLERANCE IN PHASE DETECTION CIRCUITS

CROSS-REFERENCE TO RELATED APPLICATION

This application claims priority pursuant to 35 U.S.C. §119(e) to U.S. Provisional Application Ser. No. 60/367,792, filed Mar. 26, 2002.

BACKGROUND OF THE INVENTION

1. Field of the Invention

The present invention relates to electronic circuits, and, more specifically, to phase detection circuits.

2. Description of Related Art

A PLL (phase locked loop) refers to a feedback loop in which the input and the feedback parameters of interest are the relative phases of the waveforms. The function of a PLL is to track small differences in phase between the input and feedback signal. A conventional PLL typically includes a phase detector, low-pass filter and a VCO (voltage-controlled oscillator). The phase detector measures the phase difference between its two inputs. The phase detector output is then filtered by the low-pass filter and applied to the VCO. The VCO input voltage changes the VCO frequency in a direction that reduces the phase difference between the input signal and the local oscillator. The loop is in phase lock or locked when the phase difference between the input signal and the VCO frequency is reduced to zero.

A phase detector only accepts phase information in comparing two signals. A PFD (phase/frequency detector) is also able to accept frequency information in comparing two signals. A digital PLL is a PLL system in which the VCO and loop filter are built from digital components such as gates or flip-flops. A PFD is typically made from an exclusive OR gate, or an AND gate and D-type flip-flops or a tri-state phase/frequency comparator. PLL circuits have two ranges for acquisition, a pull-in range and a capture range (also known as lock-in range). The acquisition time is the total time the PLL takes to acquire both frequency and phase lock.

A PLL circuit will produce the lowest output jitter level if it can perform phase comparisons and can phase lock using the highest input clock available. As phase measurements become more regular, the loop is updated more regularly and control is thereby maintained to reduce internal noise. Unfortunately, some systems, such as telecommunications networks, require the PLL system to be tolerant to a large amount of jitter on the clock input and still be able to maintain a lock. To maintain a lock, the system must remember the location of the 0° position and continuously pull the PLL in the direction of that location. Often the required jitter tolerance values will extend to tens of clock cycles or unit intervals (1 unit interval (UI)=1 clock cycle=360°). A conventional PLL would not be able to maintain a lock with over ±1 UI of jitter on the input. Thus, with ±10 UI of input jitter, the PLL would not know the location of the original 0° position and, as a result, cycle slippage would occur. Cycle slippage causes timing problems for the system, such as, for example, buffer overflows. Accordingly, conventional PLL circuits may not meet the requirements of systems that require a high jitter tolerance, such as telecommunications systems. Jitter tolerance is particularly difficult to provide in high frequency applications. Conventional techniques for providing jitter tolerance for high frequency applications include dividing the clock down to a fraction of the original frequency. Although the lower frequency results in proportionately lower jitter, the system suffers a loss in performance.

FIG. 10 shows a conventional type-4 PFD, indicated generally at 500, with a pair of output sampling DFF (D-type flip flop) units 505 and 510 ("Down_s" and "Up_s", respectively). The output sampling DFF units 505 and 510 are optional and would not be needed in an APLL (analog PLL) system. Note that AND gate 525 ("I1") and inverter 530 ("I2"), shown in FIG. 10, are idealized representations and in reality would incorporate some delay so that the reset pulse lasts for a sufficient duration, typically a few nanoseconds, to effectively reset DFF units 535 and 540. Generally, the output of DFF units 535 and 540 each go high on the leading edge of their respective clock inputs and remain high until they are reset. The reset signal occurs when inputs A 515 and B 520 have both gone from a low to a high state, which makes signals 'up' and 'down' both high. When both input signals A 515 and B 520 are in phase and of the same frequency, both outputs will be low for most of the time, with signals 'up' and 'down' both pulsing high only for a few nanoseconds, and no signal will be applied to the VCO (not shown in FIG. 10). If the two signal frequencies are not the same, then the output pulse widths will depend on both the relative frequency difference and the phase difference. The type-4 PFD 500 is common because of its simplicity, accuracy and ability to perform both frequency and phase locking. But, the phase capture range of the type-4 PFD is generally limited to ±360°.

FIGS. 11 and 12 show timing diagrams that illustrate the behavior of conventional PFD 500 shown in FIG. 10. If the rising edge of input A 515, shown in FIG. 11, occurs before the rising edge of input B 520, then the "up" pulse is wider than the "down" pulse, as shown in FIG. 11. The width of the up pulse is proportional to the phase difference between input A 515 and input B 520. Conversely, if the rising edge of input B 520 occurs before the rising edge of input A 515, then the down pulse is wider and has a width proportional to the phase difference. An inspection of FIG. 10 in conjunction with the timing diagrams shown in FIGS. 11–12 reveals that the inherent range of the conventional PFD 500 is limited to one cycle or UI as discussed above. The diagram shown in FIG. 12 shows the waveforms at the extreme ±360° limit. Beyond this limit, the signal begins to resemble that of FIG. 11. At this point, the 0° reference point has been lost and a cycle slip has occurred. Thus, PFD 500 is unable to operate past ±360°. Therefore it would be desirable to provide a phase detection circuit that provides an operating range that extends beyond ±360° and provides a large amount of jitter tolerance.

SUMMARY OF THE INVENTION

The present invention provides a phase detection circuit that allows the capture range, lock range and jitter tolerance to be extended beyond the ±360° limit associated with conventional PLL circuits. In an embodiment of the invention, the phase detection circuit includes a PFD (phase and frequency detector) that operates in the ±540° range.

In another exemplary embodiment of the invention, the phase detection system combines two types of phase detectors, including a coarse phase detector and a fine phase detector, e.g., the PFD, in an advantageous manner. The phase detection system uses the coarse phase detector, e.g., a digital cycle slip counter phase detector, to provide a wide phase capture and lock range for a large jitter tolerance. The phase detection system combines this detector with a fine phase measurement from the PFD for very accurate phase control and low output jitter.

The PFD allows the coarse phase detector to precondition the PFD so that the coarse and fine detectors work together with no conflict in responses and no dead-band, e.g., phase ranges not captured by either detector. The capture range for the presently disclosed phase detection circuit may be extended in programmable amounts up to several thousand clock cycles or can be set to any desired maximum capture range in steps of 360°. In an exemplary embodiment of the invention, the system and method of the present invention may be implemented in PLL systems that have some digital component such that the logical merging and arithmetic combining of phase detector results may be more easily accomplished with the digital components than with analog components.

The presently disclosed phase detection system provides a number of advantages over conventional phase detection circuits. One advantage of the present phase detection system is a wide phase capture and lock range with an unlimited maximum phase capture range. Another advantage is that the system provides accurate phase measurement in addition to the wide range. An additional advantage of the present system is a frequency lock capability. A further advantage of the present invention is the easy programmability of a maximum capture range. Another advantage of the present invention is the relative ease of programming additional options for a ±180°, ±360° or ±540° phase range. In addition, users may program additional options for ranges in multiples of 360°. Yet another advantage of the present invention is that the system may be implemented in both digital and analog systems even though some of the techniques used may be digital.

A more complete understanding of the present invention will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

The present disclosure and its numerous objects, features, and advantages may be better understood by reference to the following description of an illustrative embodiment, taken in conjunction with the accompanying drawings, in which.

DETAILED DESCRIPTION OF THE PREFERRED EMBODIMENT

The present invention satisfies the need to provide a PFD that allows the capture range, lock range and jitter tolerance to be extended beyond the ±360° limit associated with conventional phase detection circuits. In the detailed description that follows, like element numerals are used to describe like elements illustrated in one or more of the drawings.

Figure 1:
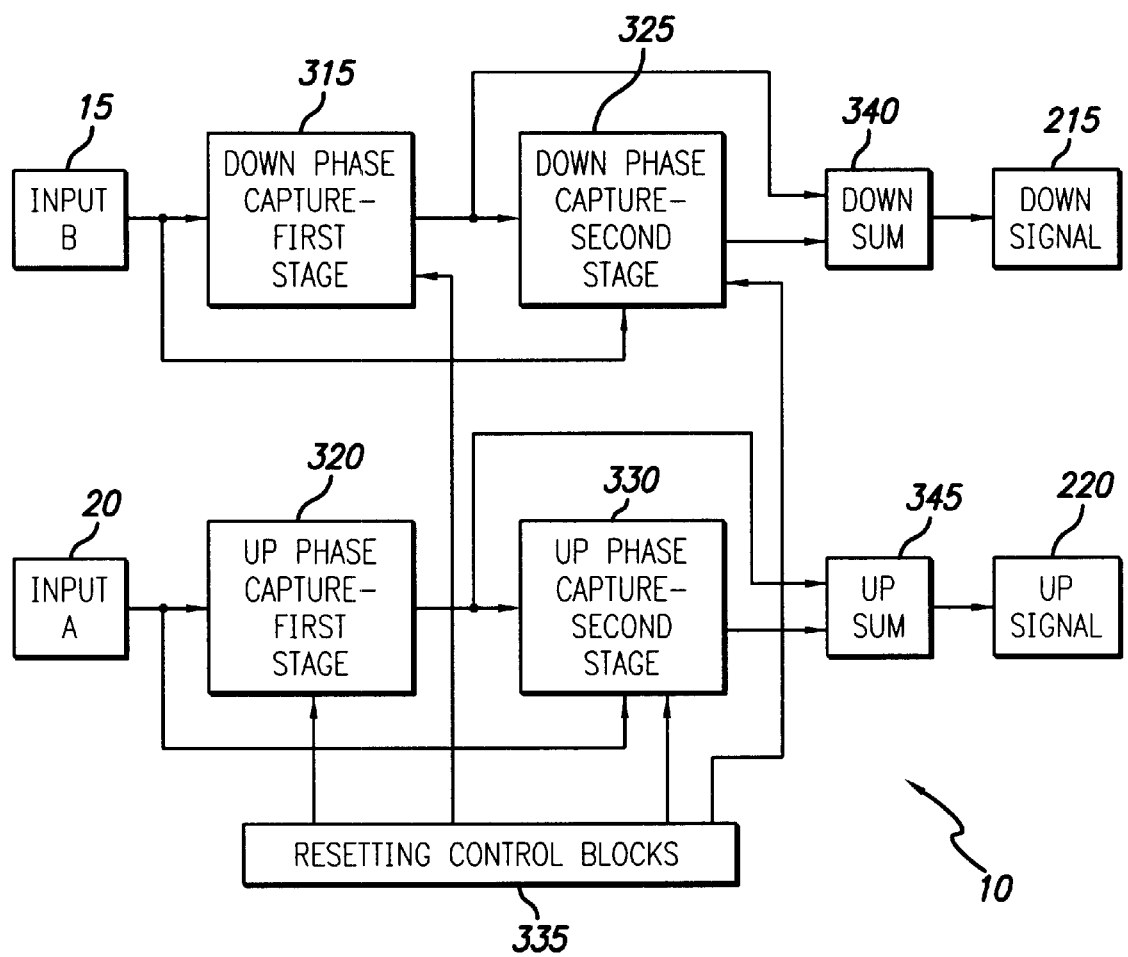
FIG. 1 is a block diagram of an exemplary embodiment of the phase frequency detector (PFD)

FIG. 1 shows a block diagram of an exemplary embodiment of the PFD of the present invention, indicated generally at 10. PFD 10 detects the phase and frequency differences between a first input signal 15 (input signal B) and a second input signal 20 (input signal A). PFD 10 contains a first stage down phase capture unit 315 to capture negative phase differences down to −360°. The output of first stage down phase capture unit 315 goes active when it detects an input B 15 rising edge. First stage down phase capture unit 315 is connected to a second stage down phase capture unit 325. The output of second stage down phase capture unit 325 may go active when a second input B 15 rising edge is detected at a point when the output of first stage down phase capture unit 315 is already active. As a result, second stage down phase capture unit 325 may capture negative phase differences down to −540°. Resetting control blocks 335 control the reset sequence of down phase capture units 315 and 325 to ensure that all phase values in the negative phase range are captured. Down sum unit 340 combines the outputs from down phase capture unit 315 and 325 to produce down signal 215, which represents the input phase difference in a negative direction.

A similar interaction occurs between the first stage up phase capture unit 320, second stage up phase capture unit 330 and resetting control blocks 335. The output of first stage up phase capture unit 320 goes active when it detects an input A 20 rising edge. This allows first stage up phase capture unit 320 to capture positive phase differences up to +360°. First stage up phase capture unit 320 is connected to a second stage up phase capture unit 330. The output of second stage up phase capture unit 330 may go active when a second input A 20 rising edge is detected at a point where the output of the first stage unit 320 is already active from the detection of the first rising edge. This allows PFD 10 to capture phase differences up to +540°. Up sum 345 combines the outputs of units 320 and 330 to produce up signal 220, which represents the input phase difference in a positive direction.

Figure 2A:
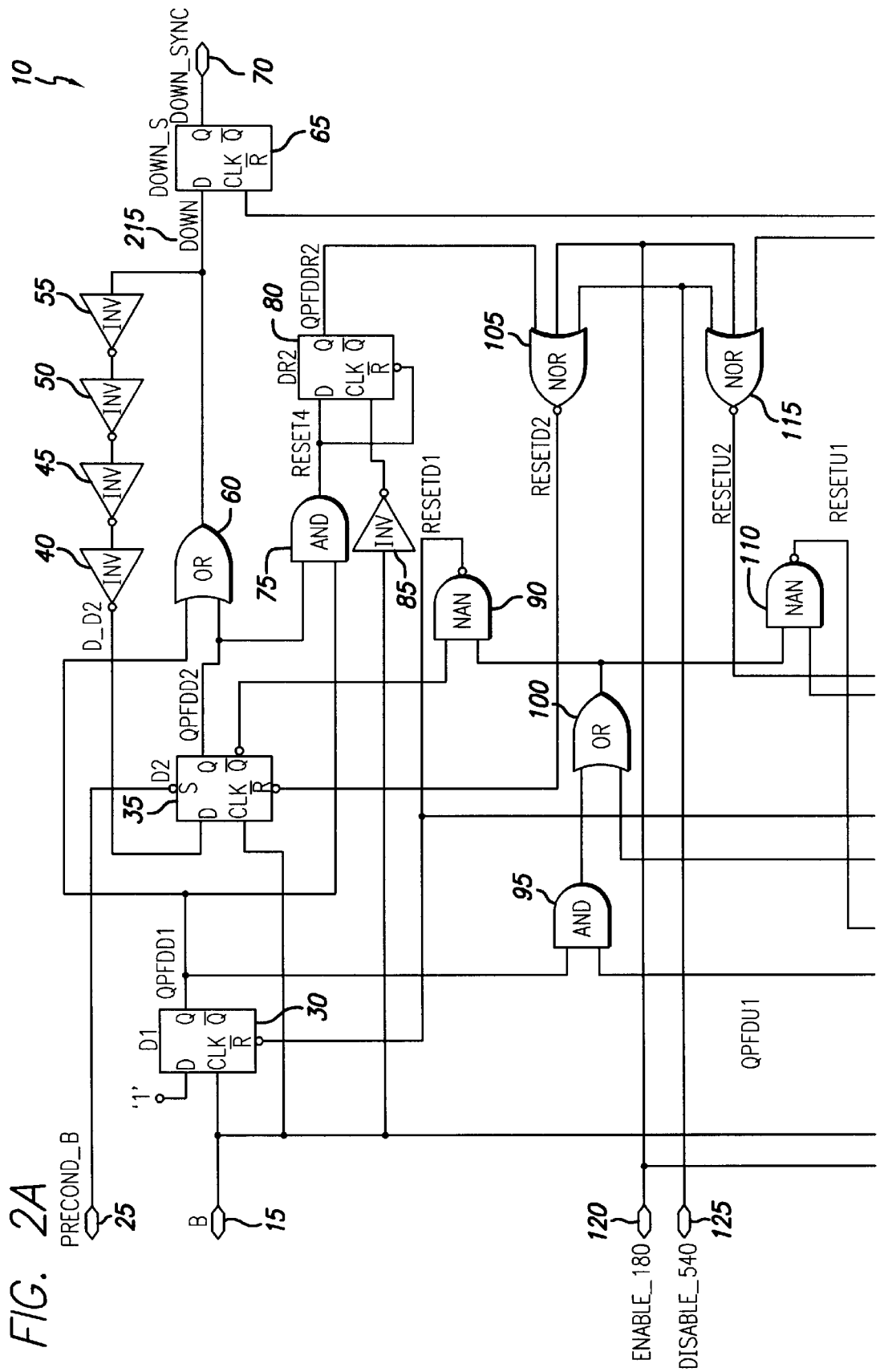
FIGS. 2A and 2B show an exemplary embodiment of the PFD.
Figure 2B:
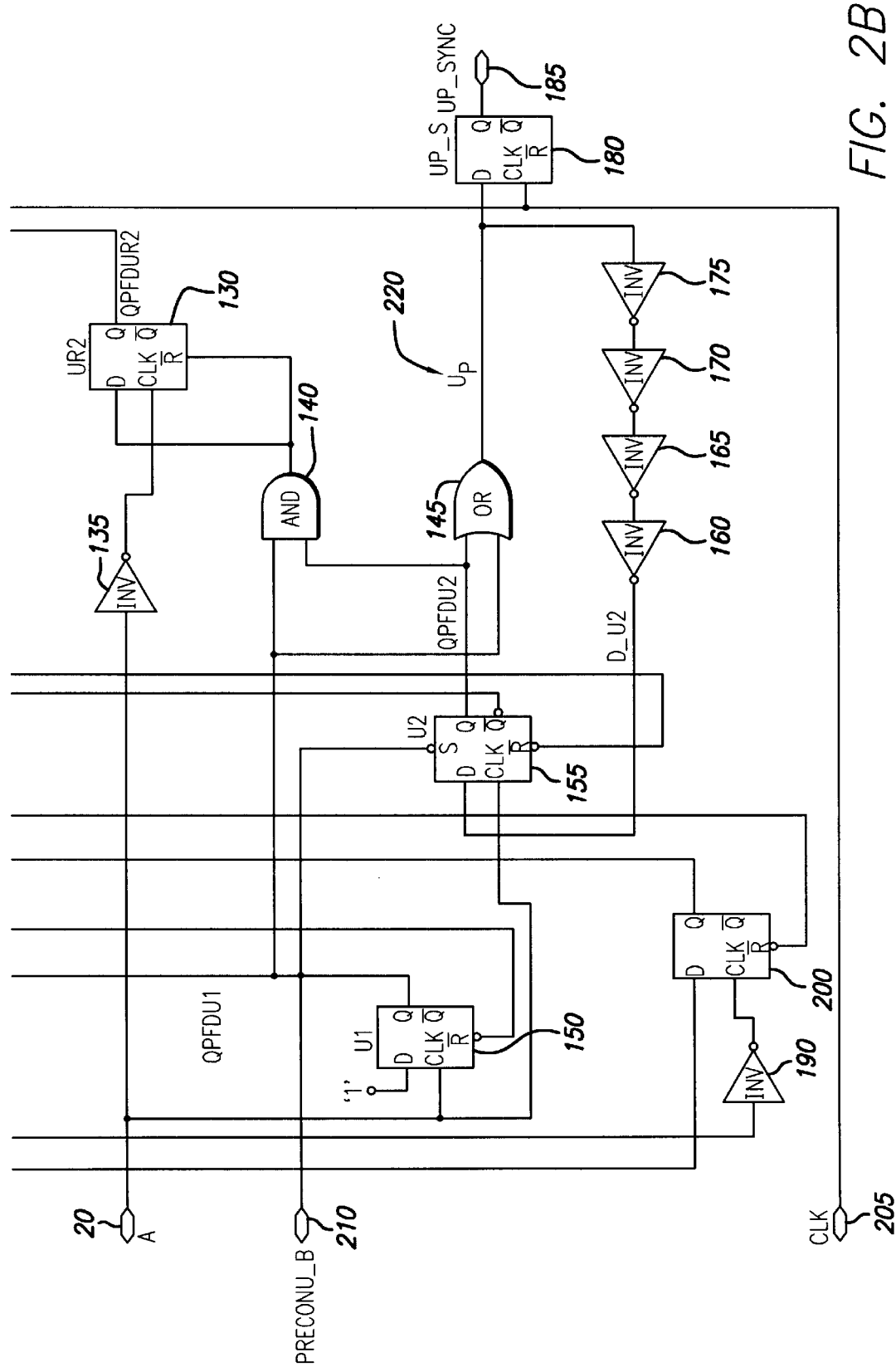
Figure 3:
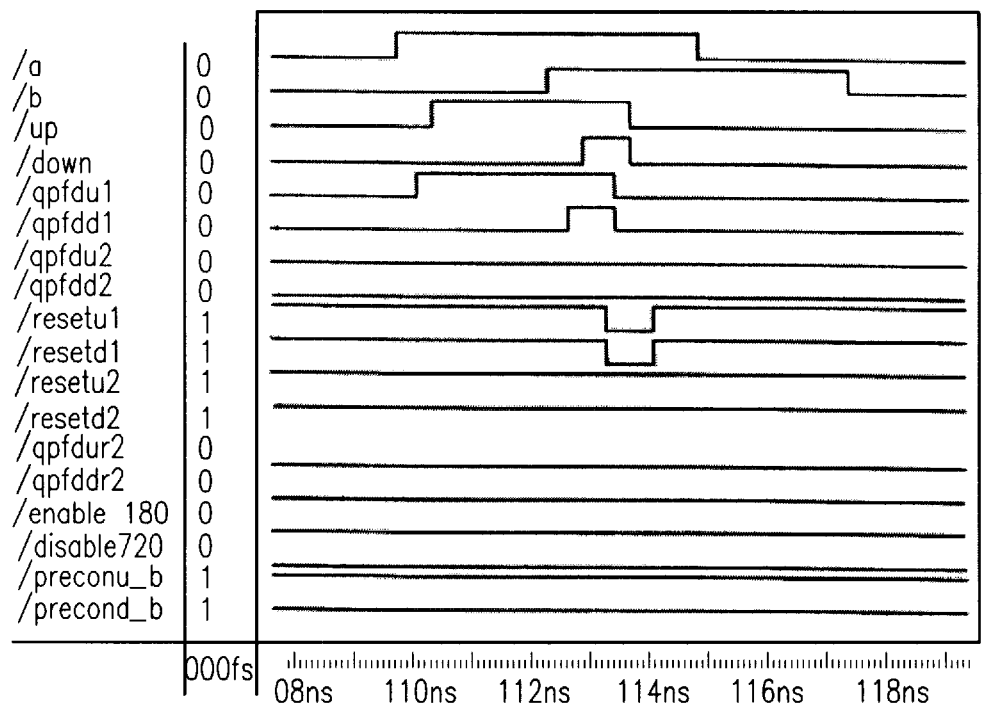
FIG. 3 is a timing diagram illustrating the performance of an exemplary embodiment of the PFD at a +90° input phase difference.

FIGS. 2A and 2B show another exemplary embodiment of the PFD of the present disclosure, indicated generally at 10. The operation of PFD 10 may be illustrated by reference to the timing diagrams depicted in FIGS. 3–7, depicting various gradually increasing phase offsets in one direction (e.g., the input A 20 rising edge occurs first). The design of PFD 10 is symmetrical in that the response to the phase offsets in the opposite direction is substantially identical, but uses flip flops 30, 35, 80 and 65 (D1, D2, DR2 and DOWN_s, respectively), shown in FIG. 2A, instead of flip flops 150, 155, 130, and 180 (U1, U2, UR2 and UP_s, respectively), shown in FIG. 2B. It should be noted that the exemplary embodiment of PFD 10 shown in FIGS. 2A and 2B is one example of implementing the required PFD functionality. One of ordinary skill in the pertinent arts will recognize that other types of gates and gate arrangements may be used to provide an equivalent functionality.

DFF units 30 (D1) and 150 (U1) allow PFD 10 to phase capture input phase difference of up to ±360°. DFF units 35 (D2) and 155 (U2) extend the phase capture range up to ±540°. PFD 10 also includes resetting control blocks to control the reset of these DFF units. Units 90, 95 and 100 serve as resetting control blocks to control the resetting of DFF 30 (D1) with signal resetd1. The resetting of DFF 150 (U1) is controlled by units 110, 100 and 95 with signal resetu1. Units 105, 80 and 75 control the resetting of DFF 35 (D2) with signal resetd2. Units 115, 130 and 140 control the resetting of DFF 155 (U2) with signal resetu2.

PFD 10 includes components to sum outputs from selected components to produce a final output signal. Block 60 combines the outputs from DFF blocks 30 and 35 (D1 and D2) to produce the final output signal Down 215. In the exemplary embodiment shown in FIG. 2A, block 60 may be an OR logical component. The output signal Down 215 represents the input phase difference, in a negative direction. Output signal Down 215 may be a pulse width varying signal. The negative direction indicates that the input B 15 rising edge occurs before the input A 20 rising edge.

Block 145 combines the outputs from DFF blocks 150 and 155 (U1 and U2) to produce the final output signal Up 220. In the exemplary embodiment shown in FIG. 2B, block 145 may be an OR logical component. The output signal Up 220 represents the input phase difference, in a positive direction. Output signal Up 220 may be a pulse width varying signal. Generally, the positive direction indicates that the input A 20 rising edge occurs before the input B 15 rising edge.

In order to provide the extended range of PFD 10, the output and resetting of the DFF components must be properly timed or sequenced. The sequencing of outputs from DFF units 30, 35 and 80 (D1, D2 and DR2, respectively), shown in FIG. 2A, provide for the extended range of PFD 10 for negative phase differences. The extended range is made possible by the output of DFF 35 (D2) going high, i.e., qpfdD2=1, in response to a second B input 15 rising edge, when the output of DFF 30 (D1), signal qpfdD1, is already high from the first B input 15 rising edge. The output signal for DFF 35 (D2), qpfdD2, goes high because the phase difference is less than −360°. As a result, PFD 10 may keep track of the 0° position past −360°.

In order to prevent the output signal from DFF 30 (D1) from being overlooked, components 40, 45, 50 and 55, shown in FIG. 2A, are used to provide a delay that is longer than the reset time for DFF 30 (D1). For example, the function of the delay components may be observed in the situation where an input A 20 rising edge closely follows an input B 15 rising edge. First, the output signal qpfdD1 from DFF 30 (D1) goes high in response to the input B 15 rising edge. Next, the output signal qpfdU1 from DFF 150 (U1) goes high in response to the input A 20 rising edge. This sequence triggers reset signal resetd1 to go low to reset DFF 30 (D1). If DFF 30 (D1) is reset too soon, then the output signal qpfdD1 from DFF 30 (D1) will not be captured by DFF 35 (D2) and, as a result, the fact that there was an input B 15 rising edge would be lost. Accordingly, the delay introduced by components 40, 45, 50 and 55 provides that qpfdD1 is high for long enough that a high signal (signal d_d2) may be read into the D input of DFF 35 (D2) before signal qpfdD1 goes low in response to reset signal resetd1.

In order to ensure that all phase values are being recorded, PFD 10 provides for a specific reset sequence of both DFF 30 (D1) and DFF 35 (D2). For example, DFF 80 (DR2) resets DFF 35 (D2) on the falling edge of the input B 15 signal when both qpfdD1 and qpfdD2 are both high. This interaction results in a phase capture range that extends to −540°. Gate 90 (I8) ensures that DFF 30 (D1) is not reset when the output signal qpfdD2 of DFF 35 (D2) is high. In order to move back from −370° to −350°, DFF 35 (D2) must be reset and not set again before DFF 30 (D1) is reset. Both of these mechanisms ensure that the range from −540° to −350° is not overlooked.

A similar sequence of events occurs for DFF units 150, 155, and 145 (U1, U2 and UR2), shown in FIG. 2B. The extended range for positive phase differences is made possible by the output of DFF 155 (U2) going high, i.e., qpfdU2=1, in response to a second A input 20 rising edge, when the output of DFF 150 (U1), signal qpdfU1, is already high from the first A input 20 rising edge signal. The high status of qpfdU2 in this case indicates that the phase difference has exceeded +360°. Accordingly, PFD 10 may keep track of the 0° position at phase differences of over +360°.

For the situation in which an input B 15 rising edge closely follows an input A 20 rising edge (the reverse of the scenario described above), components 160, 165, 170 and 175 provide a sufficient delay to ensure that signal qpfdU1, the output signal from DFF 150 (U1), is high for long enough so that a high signal (signal d_u2) may be read into the D input of DFF 155 (U2) before signal qpfdU1 goes low. As with DFF units 30 and 35 (D1 and D2), PFD10 provides a specific set of sequences for resetting DFF units 150 and 155 (U1 and U2) to ensure that phase values are not missed. For example, DFF 130 (UR2) resets DFF 155 (U2) on the falling edge of the A input when the outputs qpfdU1 and qpfdU2, from DFF 150 (U1) and 155 (U2), respectively, are both high. This provides for the +540° phase range limit. Gate 110 (I11) ensures that DFF 150 (U1) is not reset when the output of DFF 155 (U2) signal qpfdU2 is high. In moving from 350° to 370°, DFF 155 (U2) is reset and not set again until DFF 150 (U1) is reset. Accordingly, the phase value from 350° to 540° is not overlooked.

Figure 4:
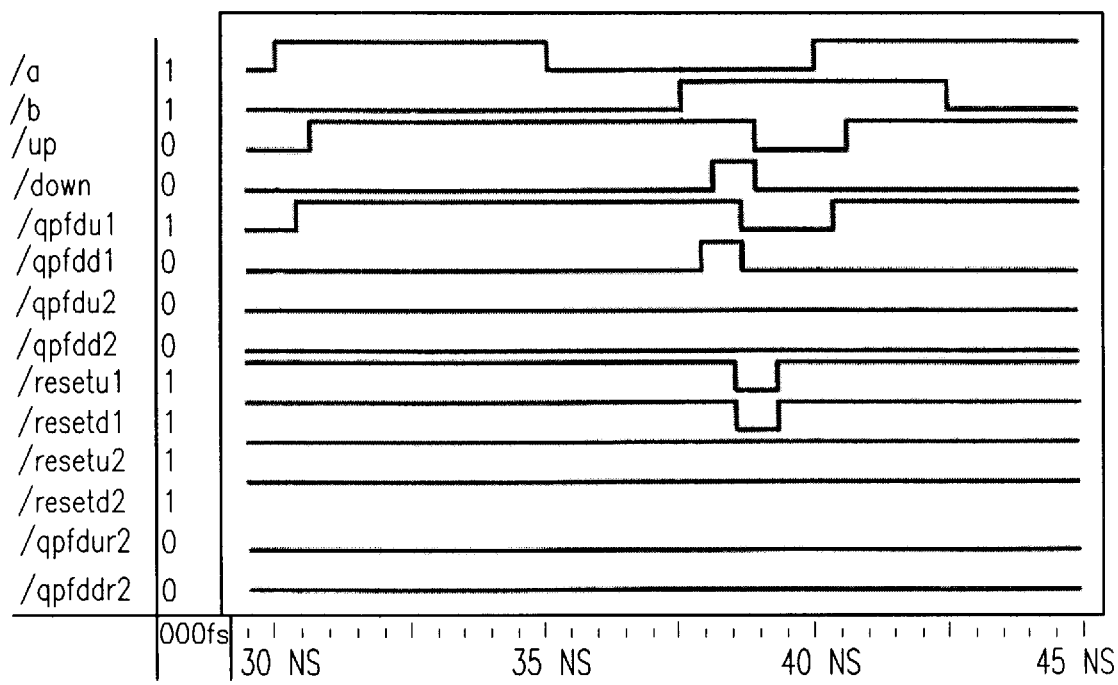
FIG. 4 is a timing diagram illustrating the performance of an exemplary embodiment of the PFD at a +270° input phase difference.
Figure 5:
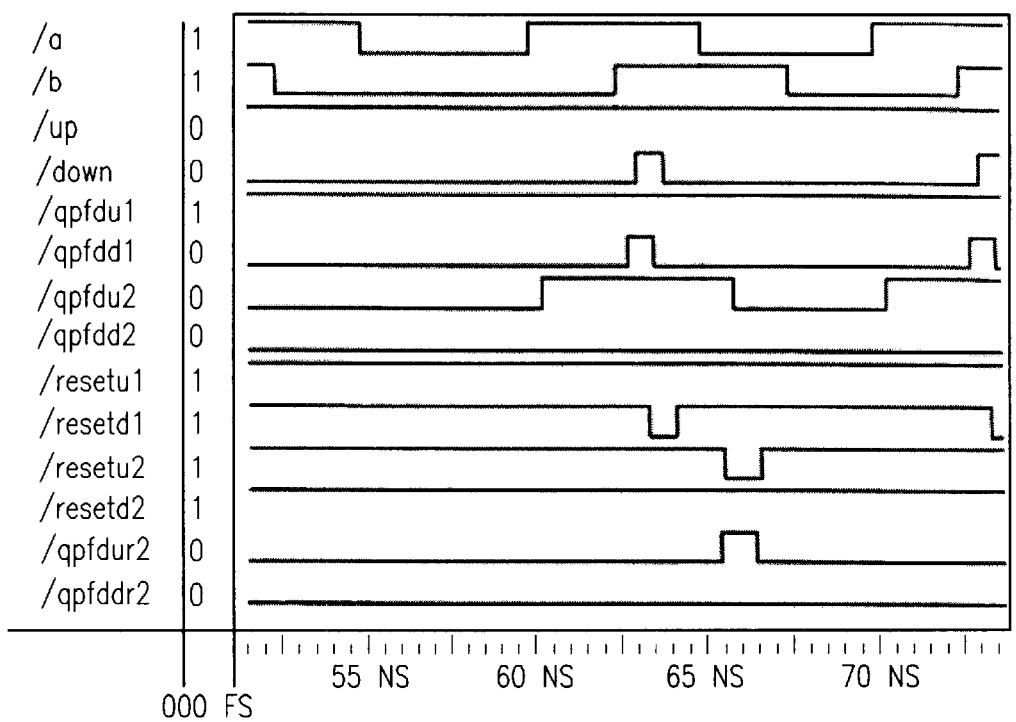
FIG. 5 is a timing diagram illustrating the performance of an exemplary embodiment of the PFD at a +450° input phase difference.
Figure 6:
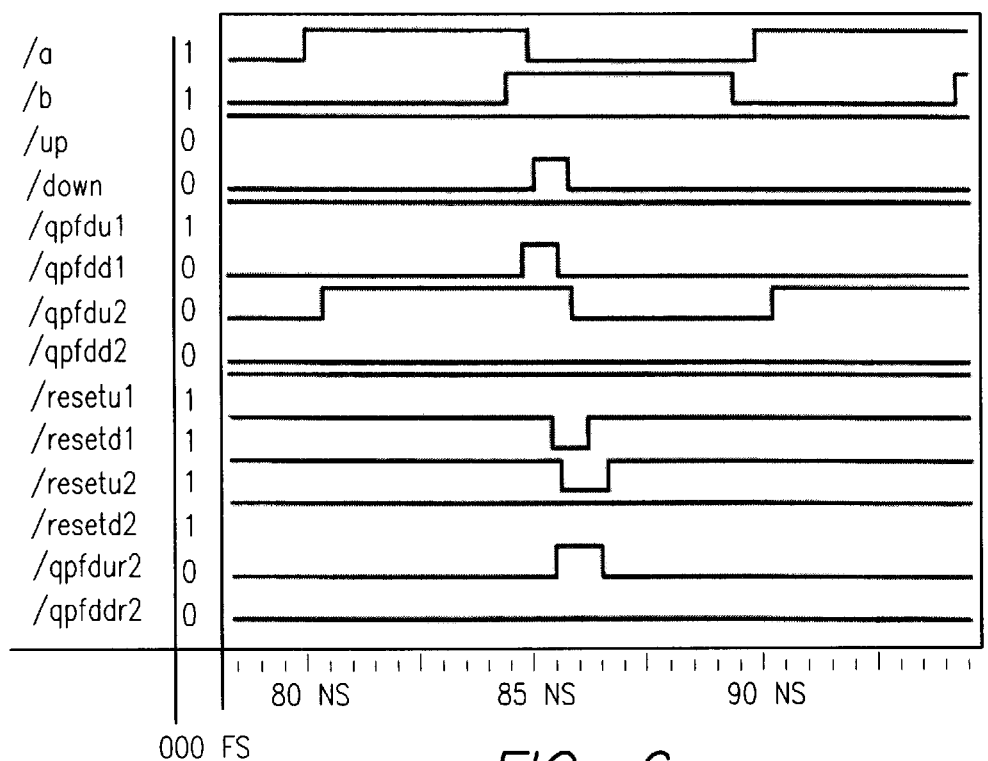
FIG. 6 is a timing diagram illustrating the performance of an exemplary embodiment of the PFD at approximately a +540° input phase difference.
Figure 7:
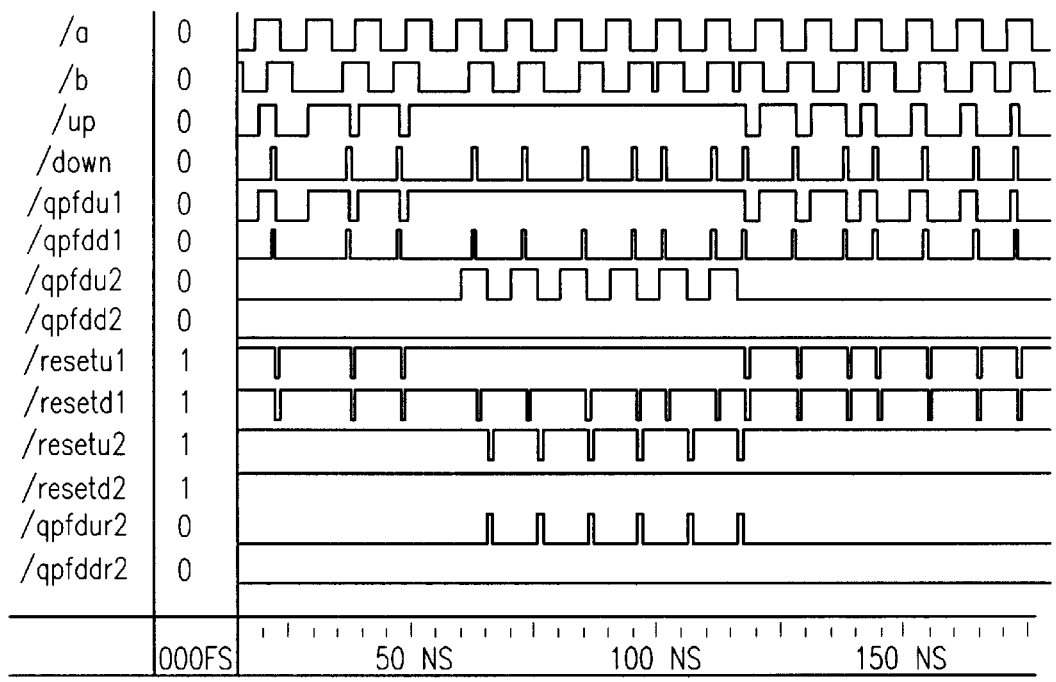
FIG. 7 is a timing diagram illustrating the performance of an exemplary embodiment of the PFD from a +90° to a +540° input phase difference and back to a 0° position.

FIGS. 3–7 show timing diagrams of an exemplary embodiment of the present invention. In FIG. 7, the phase offset between input A and input B starts at 90° and increases to 540°. When the phase position returns to 0°, the up and down pulses are balanced. Accordingly, the system 10 is able to remember the 0° phase position even for a phase offset of 540°. As a result, the system 10 has a capture range of ±540°. FIGS. 3–6 show the operation of PFD 10 at a +90°, +270°, +450° and +540° input phase difference, respectively. As shown in FIGS. 4–6, at phase offsets of over 360° the final "up" and "down" signals show that the "up" signal is continuously on during this time. This particular embodiment of PFD system 10 provides a proportional pulse width modulated phase measurement up to 360°.

In another exemplary embodiment of PFD 10, the circuit may include output sampling DFF units 180 (UP_s) and 65 (DOWN_s). DFF units 10 (Up_s) and 65 (DOWN_s) sample Up signal 220 and Down signal 215, respectively, in accordance with clock signal 205, to produce Up_sync signal 185 and Down_sync signal 70, respectively. These DFF units 180 and 65 are used for sampling into a digital system and are not necessarily required in an APLL (analog PLL) system. In another exemplary embodiment, PFD 10 may accept preconditioning signals 210 (preconU_b) and 25 (preconD_b) from a digital coarse phase detector (not shown in FIGS. 2A and 2B). The operation of the preconditioning signals is discussed below in connection with FIG. 8. PFD 10 may also have optional enabling signals engaging a ±180°, ±360° or ±540° locking range. For example, in an exemplary embodiment of PFD 10, the circuit includes signal 120 (enable_180) to enable the phase range of ±180°. Similarly, PFD 10 may include signal 125 (disable_540) to disable the extended ±540° locking range.

Figure 8:
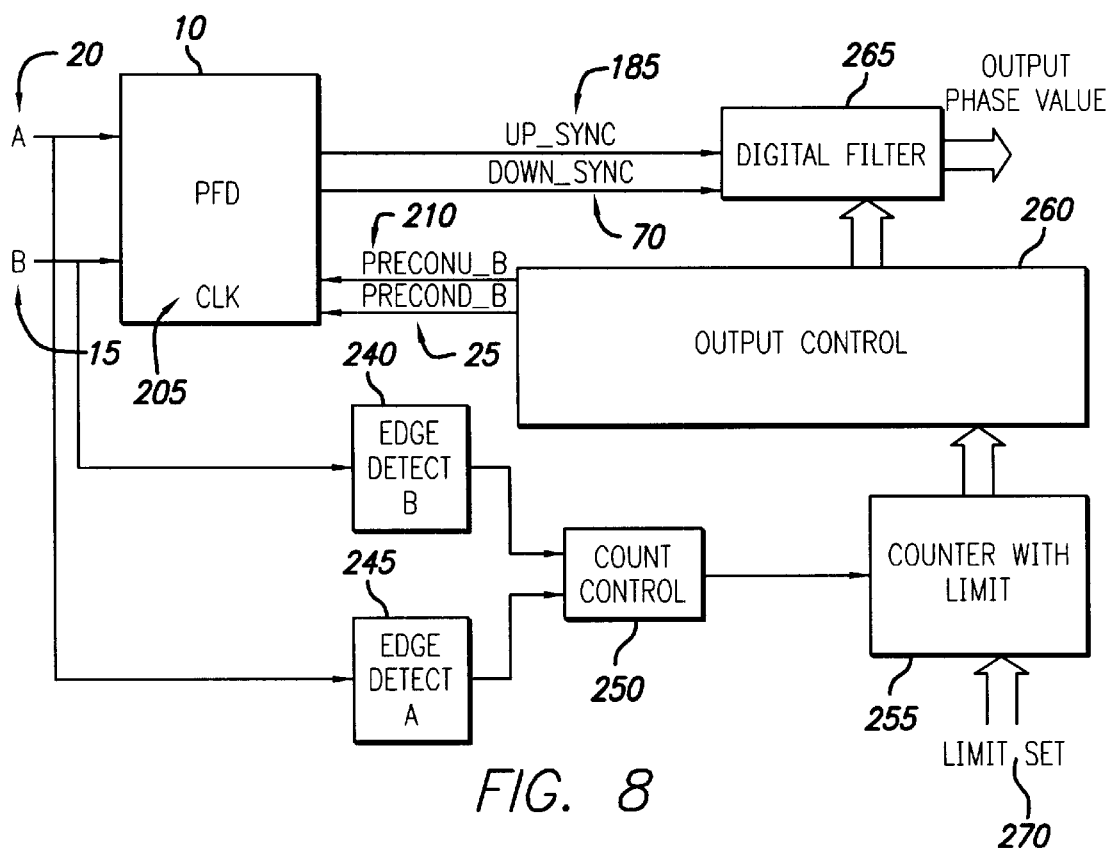
FIG. 8 is an exemplary embodiment of a system incorporating a digital phase detection scheme with the PFD.

PFD 10 may be implemented in a phase detection system with other types of phase detectors. FIG. 8 shows an exemplary embodiment of a phase detection system, shown generally at 280. Phase detection system 280 includes PFD 10 and a coarse digital phase detector. In this particular embodiment, the coarse digital phase detector is an up/down digital counter that may be used to measure complete cycle slips. The digital counter may be based on any suitable numbering scheme or concept. Generally, a digital counter can count cycles but does not track the location of a 0° position as well as a fine phase detector such as, for example, PFD 10. Accordingly, phase detection system 10 combines the digital counter's ability to track cycle slips with the ability of PFD 10 to track and lock in to a 0° position. Because PFD 10 and the coarse phase detector provide an overlap in response, there is substantially no dead-band in the transition between the two phase detectors.

Phase detection system includes edge detect components 240 and 245. The rising edge of input clock signal B 15 and input clock signal A 20 is detected by input B edge detect 240 and input A edge detect 245, respectively. The outputs of edge detect 240 and 245 are connected to count control 250. Count control 250 is connected to counter 255. Count control 250 handles the decision to increment, decrement or make no change to counter 255. Counter 255 increments when the rising edge of input A 20 is detected. Counter 255 decrements when the rising edge of input B 15 is detected. When both are detected at the same time, no counter change is made. Counter 255 is associated with a programmable limit set 270. Limit set 270 defines the maximum and minimum counter value. This maximum and minimum counter value corresponds to the required phase capture range. For example, with a maximum counter value of 8191, the phase capture range of the whole system would be 8191×360°=2,948,760°.

Generally, counter 255 will produce +1, −1 or 0 count values when the A and B input edges are close to each other. If the distance between the edges exceeds a defined phase difference, then counter 255 may increment or decrement by larger count values. For example, at +360° phase offset, the counter may produce +2, 0 or +1 count values. The coarse phase detector value may be used when the count value is greater than +1 or less than −1.

Counter 255 is connected to output control 260. Output control 260 handles the decision of whether to use the coarse phase detector value. If output control 260 decides to use the coarse phase detector value from counter 255, then this value will be sent to digital filter 265. Digital filter 265 averages the count value along with the up and down output signals from PFD 10. Accordingly, the output of digital filter 265 is a representation of the input phase. Digital filter 265 averages the PWM (pulse width modulated) signals of Up_sync 185 and Down_sync 70 from PFD 10 in addition to the different count values from counter 255. The count values are also effectively PWM signals because, for example, the +2 and +3 values would provide greater precision after averaging and resolving down to fractions of a period. For instance, in a stream of 100 counter values, with 35 values of +2 and 65 values of +3, the measured phase value from the averaging digital filter 265 would be +2.35. Note that in this exemplary embodiment, the sampled signals 185 and 70 are used because PFD 10 is connected with a digital component, i.e., digital filter 265.

Output control 260 may also send preconditioning signals 25 and 210 to PFD 10. As discussed above, the preconditioning signals are used to ensure that PFD 10 and the coarse phase detector operate in a harmonious fashion. Without this link, the two phase detectors may pull in opposite directions. The manner in which PFD 10 is preconditioned by signals 210 (preconU_b) and 25 (preconD_b) is based on the counter value currently tallied by digital counter 255. If the counter value is a positive, non-zero number, then there is a phase difference in the positive phase direction between the two input signals 15 and 20. Accordingly, preconditioning signal 210 (preconU_b) should be asserted to indicate that to PFD 10 that there is a phase change in the positive phase direction. On the other hand, if the counter value is a negative number, then there is a phase difference in the negative direction. As a result, preconditioning signal 25 (preconD_b) should be asserted to indicate to PFD 10 that there is a phase change in the negative phase direction. In one exemplary embodiment, PFD 10 is preconditioned according to the logical description shown in Table I based on the exemplary embodiment of PFD 10 shown in FIGS. 2A and 2B (e.g., the preconditioning signals are active low).

TABLE I

| Counter | PreconD_b | preconU_b |
| --- | --- | --- |
| <−1 | goes to 0 | goes to 1 |
| >1 | goes to 1 | goes to 0 |
| 0, 1 or −1 | goes to 1 | goes to 1 |

The application of the preconditioning signals ensures a smooth continuation of phase measurement across the 360° boundary and maintains the memory of the 0° phase position.

In the exemplary embodiment shown in FIG. 8, PFD 10, Edge detects 240 and 245, counter 255, output control 260 and digital filter 265 are all clocked components. The resolution of the system is determined by the system clock rate that drives all of the digital blocks and whether the system clock is synchronized with the main clock.

Figure 9:
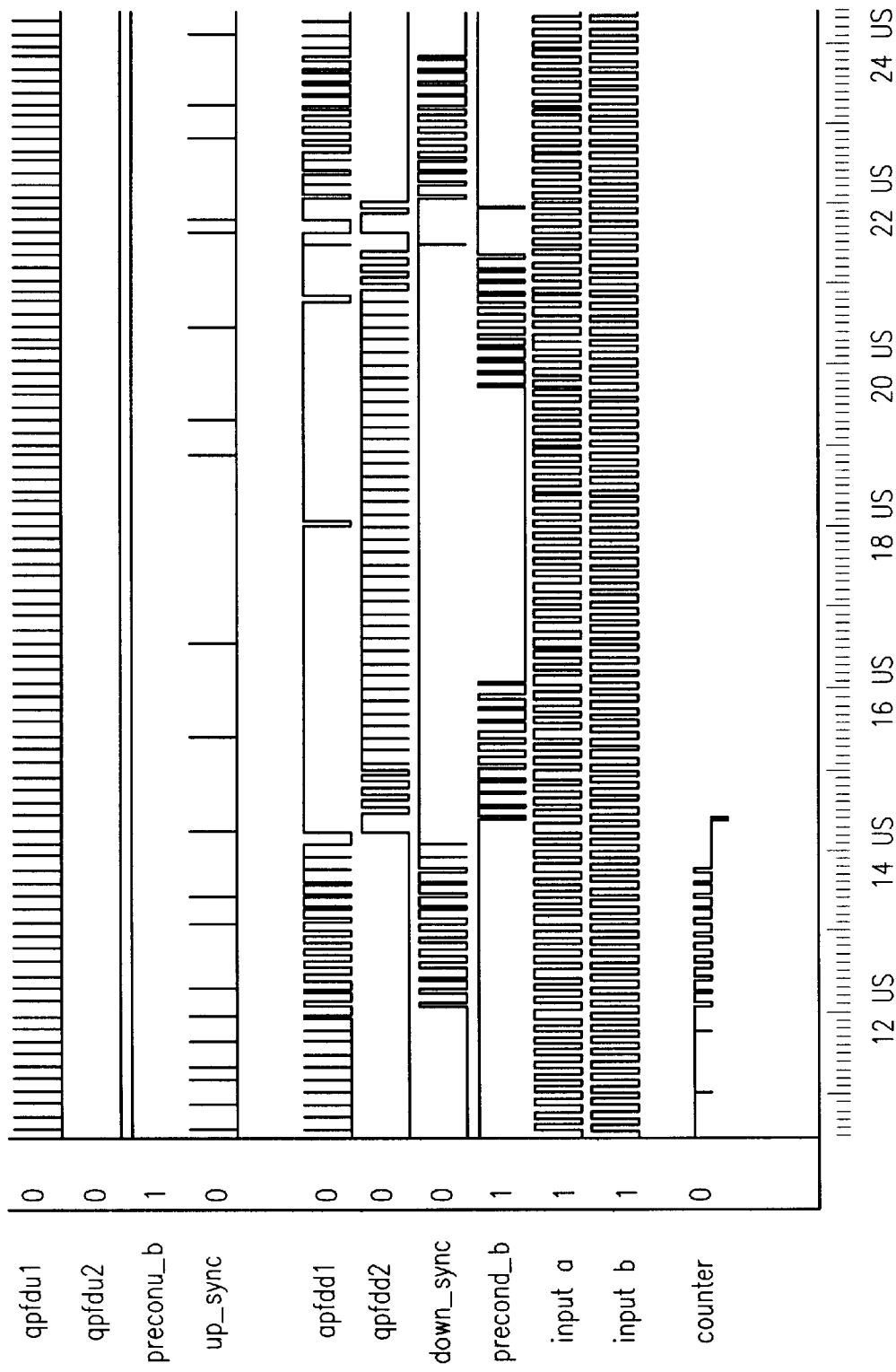
FIG. 9 is a timing diagram illustrating the performance of the system shown in FIG. 7 during a phase sweep from 0 to 250 UI (900°) and back to a 0° position.
Figure 10:
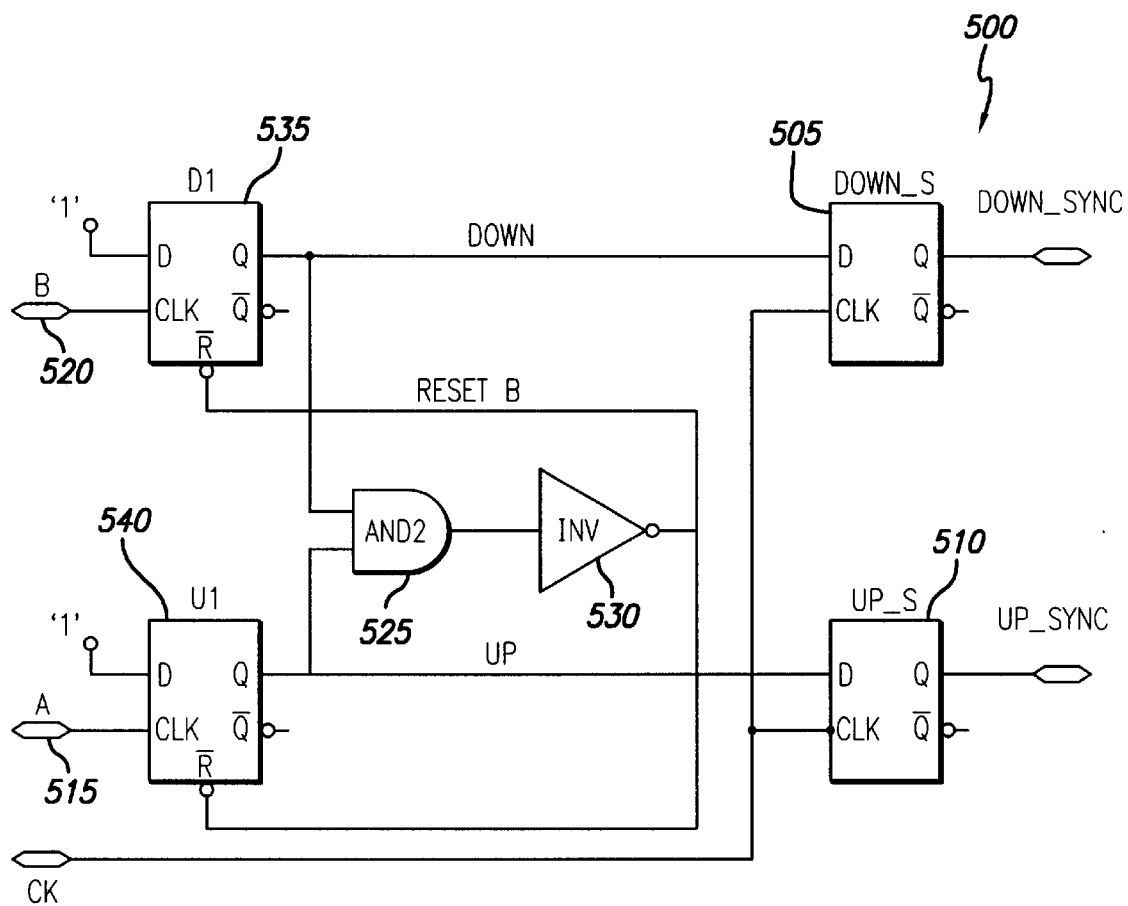
FIG. 10 shows a prior art PFD.
Figure 11:
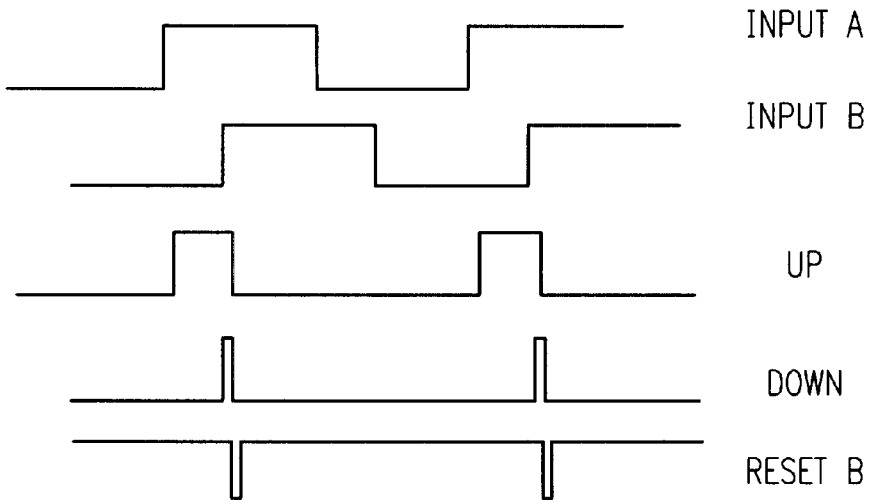
FIG. 11 is a timing diagram illustrating the performance of the prior art PFD with a minor phase difference.
Figure 12:
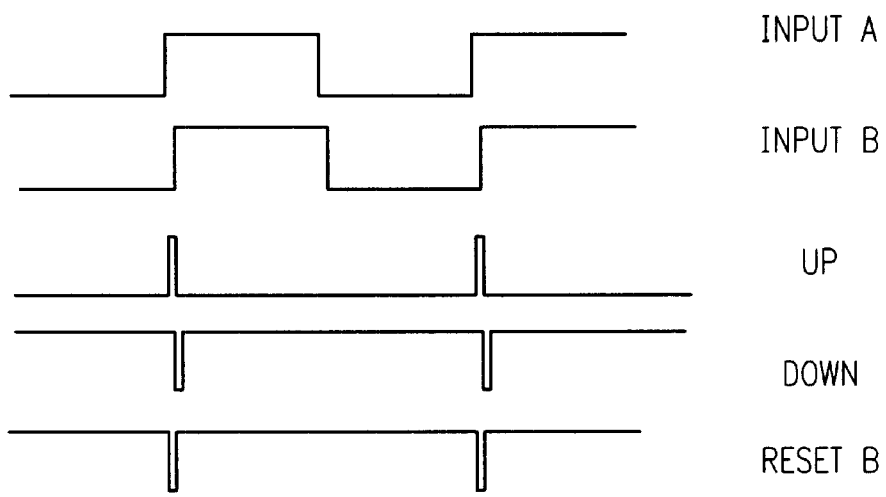
FIG. 12 is a timing diagram illustrating the performance of the prior art PFD at the 360° phase difference limit.

FIG. 9 depicts a phase sweep showing a range from 0 UI to +2.5 UI (+900°) and back to 0 U1. The simulation waveform illustrates the interaction of the components of the system shown in FIG. 8 to track a varying input phase difference. With preconditioning from digital phase counter 255, the system can keep track of many cycles. As shown in FIG. 9, the system goes to +2.5 UI and then completely recovers to the same position back at 0 UI (0°). The counter value from counter 255 steps from 0 to −3 and back to 0 again. The digital count value is represented by an analog waveform. When the count value is less than −1, then signal 25 (preconD_b) activates, e.g., active low, which preconditions DFF 35 (D2) and output qpfdD2 to go high. This high signal notifies PFD 10 that digital counter 255 is indicating that the phase is at least less than −360°. Accordingly, FIG. 9 shows that phase detection system 280 remembers the 0° position and is able to return to this position rather than lock one or more cycles away.

Having thus described a preferred embodiment of the phase detection system, it should be apparent to those skilled in the art that certain advantages of the described method and system have been achieved. It should also be appreciated that various modifications, adaptations, and alternative embodiments thereof may be made within the scope and spirit of the present invention. For example, particular gates and gate arrangements have been illustrated, but it should be apparent that the inventive concepts described above would be equally applicable to alternate gates and gate arrangements that provide equivalent functionality. The invention is further defined by the following claims.

What is claimed is:

1. A phase and frequency detector (PFD) operable to detect phase and frequency differences between a first input signal and a second input signal, comprising:
   a first and second logical component operable to capture phase differences between the first and second input signals of up to about ±360°, wherein the first logical component captures phase differences in the positive direction and the second logical component captures phase differences in the negative direction;
   a third and fourth logical component operable to capture phase differences between the first and second input signals of between about ±360° to about ±540°, wherein the third logical component captures phase differences in the positive direction and the fourth logical component captures phase differences in the negative direction;
   a plurality of resetting control blocks operable to reset the first, second, third and fourth logical components;
   a first summation block to combine an output of the first logical component and an output of a third logical component to produce an up output signal that represents the positive input phase difference; and
   a second summation block to combine an output of the second logical component and an output of the fourth logical component to produce a down output signal that represents the negative input phase difference.

2. The PFD of claim 1, wherein the first, second, third and fourth logical components comprise D-type flip flops.

3. The PFD of claim 1, wherein the PFD is operable to receive preconditioning signals from a coarse digital phase detector and thereby communicatively couple with a coarse digital phase detector.

4. The PFD of claim 1, further comprising:
   a first output sampling logical component operable to receive the up output signal and process the up output signal into an up output synchronized signal suitable for sampling into a digital system; and
   a second output sampling logical component operable to receive the down output component and process the down output signal into a down output synchronized signal suitable for sampling into a digital system.

5. The PFD of claim 1, further comprising an enabling signal to selectively engage a selected locking range.

6. The PFD of claim 5, wherein the enabling signal is operable to select between a ±180°, ±360° or ±540° locking range.

7. A phase detection system comprising:
   a coarse phase detector operable to detect a phase difference between a first input signal and a second input signal; and
   a phase and frequency detector (PFD) operable to detect a phase difference of about ±540° between the first input signal and the second input signal and transmit an up output signal corresponding to a positive phase difference and a down output signal corresponding to a negative phase difference wherein the PFD is communicatively coupled to the coarse phase detector such that the coarse phase detector is operable to communicate a substantially 0° position to the PFD over a plurality of clock cycles and transmit a preconditioning signal to the PFD to provide that the coarse phase detector and the PFD pull in the same direction.

8. The phase detection system of claim 7, further comprising:
   a first edge detector operable to detect the rising edge of the first input signal;
   a second edge detector operable to detect the rising edge of the second input signal;
   a counter operable to maintain a count value associated with a programmable limit corresponding to a phase capture range;
   a count controller coupled to the first edge detector and the second edge detector and operable to increment the counter when the rising edge of the first input signal is detected and decrement the counter when the rising edge of the second input signal is detected;
   an output controller operable to send a selected preconditioning signal to the PFD based on the value of the count value; and
   a digital filter operable to transmit an output phase value based on the up output signal and the down output signal from the PFD and the count value.

9. The phase detection system of claim 8, wherein the output phase value is an average of the up output signal and the down output signal from the PFD and the count value.

10. The detection system of claim 9, wherein the PFD comprises:
    a first and second logical component operable to capture phase differences between the first and second input signals of up to about ±360°, wherein the first logical component captures phase differences in the positive direction and the second logical component captures phase differences in the negative direction;
    a third and fourth logical component operable to capture phase differences between the first and second input signals of between about ±360° to about ±540°, wherein the third logical component captures phase differences in the positive direction and the fourth logical component captures phase differences in the negative direction;
    a plurality of resetting control blocks operable to reset the first, second, third and fourth logical components;
    a first summation block to combine an output of the first logical component and an output of the third logical component to produce the up output signal; and
    a second summation block to combine an output of the second logical component and an output of a fourth logical component to produce the down output signal.

11. The phase detection system of claim 10, wherein the first, second, third and fourth logical components of the PFD comprise D-type flip flops.

12. The phase detection system of claim 11, wherein the PDF further comprises:
    a first output sampling logical component operable to receive the up output signal and process the up output signal into an up output synchronized signal suitable for sampling into a digital system; and
    a second output sampling logical component operable to receive the down output component and process the down output signal into a down output synchronized signal suitable for sampling into a digital system.

13. The phase detection system of claim 12, wherein the PDF further comprises an enabling signal to selectively engage a selected locking range.

14. The phase detection system of claim 13, wherein the enabling signal is operable to select between a ±180°, ±360° or ±540° locking range.

15. A method for detecting a phase difference between a first input signal and a second input signal, comprising the steps of:

receiving the first input signal;

receiving the second input signal;

capturing a first phase of the phase difference between the first input signal and the second input signal up to about +540°, if there is a positive phase difference between the first input signal and the second input signal;

capturing a second phase of the phase difference between the first input signal and the second input signal down to about −540°, if there is a negative phase difference between the first input signal and the second input;

generating a first output signal representing the first phase; and generating a second output signal representing the second phase.

16. The method of claim 15, further comprising the steps:

providing a counter associated with a counter value;

detecting a rising edge of the first input signal and incrementing the counter value by a selected amount;

detecting a rising edge of the second input signal and decrementing the counter value by a selected amount; and generating an output phase value based on the first output signal, the second output signal and the counter value.

17. The method of claim 16, wherein the output phase value is an average of the first output signal, the second output signal and the counter value.

* * * * *